(12) United States Patent
Kambara et al.

(10) Patent No.: US 12,246,963 B2
(45) Date of Patent: Mar. 11, 2025

(54) HYDROGEN RECYCLE SYSTEM AND HYDROGEN RECYCLE METHOD

(71) Applicants: National University Corporation Tokai National Higher Education and Research System, Aichi (JP); SAWAFUJI ELECTRIC CO., LTD., Gunma (JP)

(72) Inventors: Shinji Kambara, Aichi (JP); Yukio Hayakawa, Aichi (JP); Tomonori Miura, Gunma (JP); Tatsuya Ikeda, Gunma (JP)

(73) Assignees: National University Corporation Tokai National Higher Education and Research System, Aichi (JP); SAWAFUJI ELECTRIC CO., LTD., Gunma (JP)

( * ) Notice: Subject to any disclaimer, the term of this patent is extended or adjusted under 35 U.S.C. 154(b) by 0 days.

(21) Appl. No.: 18/598,591

(22) Filed: Mar. 7, 2024

(65) Prior Publication Data

US 2024/0217811 A1 Jul. 4, 2024

Related U.S. Application Data

(62) Division of application No. 17/056,265, filed as application No. PCT/JP2019/019628 on May 17, 2019, now Pat. No. 12,024,427.

(30) Foreign Application Priority Data

Jun. 5, 2018 (JP) .................. 2018-107532

(51) Int. Cl.
*C01B 3/04* (2006.01)
*B01D 53/04* (2006.01)
(Continued)

(52) U.S. Cl.
CPC .............. *C01B 3/047* (2013.01); *B01D 53/04* (2013.01); *B01D 53/229* (2013.01); *C01B 3/503* (2013.01);
(Continued)

(58) Field of Classification Search
CPC ........... C01B 3/047; C01B 3/503; C01B 3/56; C01B 2203/041; C01B 2203/0425;
(Continued)

(56) References Cited

U.S. PATENT DOCUMENTS 7,037,484 B1 * 5/2006 Brandenburg ......... B01J 19/088
204/157.52
10,065,170 B2 9/2018 Kambara et al.
(Continued)

FOREIGN PATENT DOCUMENTS

CN 101679028 A 3/2010
CN 102179169 A 9/2011
(Continued)

*Primary Examiner* — Xiuyu Tai
(74) *Attorney, Agent, or Firm* — KENEALY VAIDYA LLP

(57) ABSTRACT

Provided are a hydrogen recycle system and a hydrogen recycle method, whereby hydrogen can be purified to high purity at high yield from a gas, said gas being exhausted from a nitride compound production device, and recycled. The hydrogen recycle system 1 comprises an exhaust gas supply path 11 supplying a gas exhausted from a nitride compound production device 2, a hydrogen recycle means 10 and a hydrogen supply path 12. The hydrogen recycle means 10 of the hydrogen recycle system 1 is characterized by comprising: a plasma reaction vessel 31 that defines at least a part of a discharge space 32; a hydrogen separation membrane 34 that divides the discharge space 32 from a hydrogen flow path 33 communicated with the hydrogen supply path 12, defines at least a part of the discharge space 32 by one surface thereof and also defines at least a part of (Continued)

the hydrogen flow path 33 by the other surface thereof; an electrode 35 that is disposed outside the discharge space 32; and an adsorbent 36 that is filled in the discharge space 32 and adsorbs the supplied exhaust gas.

4 Claims, 6 Drawing Sheets

(51) Int. Cl.
| | |
|---|---|
| *B01D 53/22* | (2006.01) |
| *C01B 3/50* | (2006.01) |
| *C01B 3/56* | (2006.01) |
| *C23C 16/30* | (2006.01) |
| *C23C 16/44* | (2006.01) |
| *C23C 16/455* | (2006.01) |
| *C30B 25/14* | (2006.01) |
| *C30B 29/40* | (2006.01) |
| *H01L 21/02* | (2006.01) |
| *H01M 8/0606* | (2016.01) |

(52) U.S. Cl.
CPC .............. *C01B 3/56* (2013.01); *C23C 16/303* (2013.01); *C23C 16/4412* (2013.01); *C23C 16/45593* (2013.01); *C30B 25/14* (2013.01); *C30B 29/406* (2013.01); *H01L 21/0254* (2013.01); *H01L 21/0262* (2013.01); *B01D 2053/221* (2013.01); *B01D 2253/104* (2013.01); *B01D 2253/108* (2013.01); *B01D 2256/16* (2013.01); *B01D 2259/40083* (2013.01); *B01D 2259/45* (2013.01); *C01B 2203/041* (2013.01); *C01B 2203/0425* (2013.01); *C01B 2203/0861* (2013.01); *H01M 8/0606* (2013.01)

(58) Field of Classification Search
CPC .... C01B 2203/0861; C01B 2203/0435; C01B 2203/042; B01D 53/04; B01D 53/229; B01D 2053/221; B01D 2253/104; B01D 2253/108; B01D 2256/16; B01D 2259/40083; B01D 2259/45; B01D 53/58; B01D 53/145; B01D 2259/40052; B01D 2258/0283; B01D 2253/1122; B01D 2257/108; B01D 53/1406; B01D 53/047; B01D 53/261; B01D 53/1493; B01D 53/8671; B01D 53/78; B01D 53/0462; B01D 51/00; B01D 51/10; B01D 2257/10; B01D 2252/103; B01D 2259/40039; B01D 2253/102; B01D 2259/41; B01D 2257/80; B01D 2253/106; B01D 2257/406; B01D 53/22; C23C 16/303; C23C 16/4412; C23C 16/45593; C23C 16/4402; C30B 25/14; C30B 29/406; H01L 21/0254; H01L 21/0262; H01M 8/0606; H01M 8/0687; H01M 2250/20; B01J 19/088; B01J 2219/0809; B01J 2219/0815; Y02C 20/20; Y02C 20/30; Y02E 60/50; Y02E 60/36; Y02T 90/40

See application file for complete search history.

(56) References Cited

U.S. PATENT DOCUMENTS

| | | | |
|---|---|---|---|
| 2005/0214181 | A1 | 9/2005 | Kaneko et al. |
| 2008/0107592 | A1 | 5/2008 | Adams |
| 2008/0128267 | A1 | 6/2008 | Adams |
| 2008/0131360 | A1 | 6/2008 | Adams |
| 2008/0131744 | A1 | 6/2008 | Adams |
| 2008/0135807 | A1 | 6/2008 | Adams |
| 2008/0138676 | A1 | 6/2008 | Adams |
| 2009/0035619 | A1 | 2/2009 | Adams |
| 2010/0071549 | A1* | 3/2010 | Grant .................. C23C 16/4412 95/20 |
| 2012/0198998 | A1* | 8/2012 | Kurosawa .......... B01D 53/1493 95/132 |
| 2014/0322124 | A1 | 10/2014 | Izaki et al. |
| 2015/0211378 | A1 | 7/2015 | Johnson et al. |
| 2015/0238922 | A1 | 8/2015 | Kambara et al. |
| 2016/0101987 | A1 | 4/2016 | Izaki et al. |
| 2019/0135621 | A1 | 5/2019 | Kambara et al. |
| 2022/0274046 | A1 | 9/2022 | Johnson et al. |

FOREIGN PATENT DOCUMENTS

| | | |
|---|---|---|
| CN | 104661955 A | 5/2015 |
| CN | 105939772 A | 9/2016 |
| JP | H11-285613 A | 10/1999 |
| JP | 2005313108 A | 11/2005 |
| JP | 2007-307514 A | 11/2007 |
| JP | 2014-70012 A | 4/2014 |
| JP | 2014-214060 A | 11/2014 |
| JP | 6241803 B1 | 12/2017 |

* cited by examiner

HYDROGEN RECYCLE SYSTEM AND HYDROGEN RECYCLE METHOD

This application is a divisional of and claims the priority benefit under 35 U.S.C. § 120 of U.S. patent application Ser. No. 17/056,265 filed on Nov. 17, 2020 which in turn is a National Stage application filed under 35 U.S.C. § 371 of PCT Application No. PCT/JP2019/019628 filed on May 17, 2019, which claims priority under 35 U.S.C. § 119 to JP2018-107532 filed in Japan on Jun. 5, 2018, which are all hereby incorporated in their entireties by reference.

TECHNICAL FIELD

The present invention relates to a hydrogen recycle system and a hydrogen recycle method and, in particular, to a hydrogen recycle system that recycles hydrogen by purifying high-purity hydrogen from a hydrogen-containing exhaust gas emitted from a metalorganic chemical vapor deposition (MOCVD) device, and a method for recycling hydrogen from the exhaust gas emitted from a MOCVD device.

BACKGROUND ART

In recent years, use of compound semiconductors instead of conventional silicon semiconductors has become widespread in light-emitting devices such as light-emitting diodes or in high-frequency devices, power semiconductor devices and the like. In particular, the demand for gallium nitride semiconductors, in which gallium nitride (GaN) is used, is increasing, and technology for producing such semiconductors has developed rapidly in recent years. GaN semiconductors are produced by growing a thin film crystal of GaN on a substrate made of silicon, sapphire, etc. using MOCVD. In the MOCVD process for producing GaN semiconductors, in addition to the organic metal, the cost of producing raw material gas and carrier gas is high, as is the cost required for exhaust gas treatment. Adding up the costs for producing these gases and treating the exhaust gas, they may account for as much as 10 to 20% of the total production cost. Moreover, since the equipment used in the MOCVD process consumes a lot of electric power, there is a need for energy conservation at the time of production.

Patent Document 1 discloses a method for recovering hydrogen from an exhaust gas containing ammonia, hydrogen, nitrogen, and organic metal compounds that is emitted from a production process of a gallium nitride-based compound semiconductor. In the method for reusing hydrogen disclosed in Patent Document 1, the exhaust gas is brought into contact with a cleaning agent to remove organic metal compounds and then into contact with an ammonia decomposition catalyst to decompose ammonia into nitrogen and hydrogen, and after the above treatments the exhaust gas is further brought into contact with a palladium alloy membrane under a heated condition to recover hydrogen that permeates the palladium alloy membrane. In the method for recovering and reusing hydrogen disclosed in Patent Document 1, the palladium alloy membrane needs to be heated to a temperature of 350 to 500 degrees Celsius and be pressurized to a gauge pressure of 0.3 to 0.8 MPa. Therefore, a pressurizing pump and an electric heater are required to make the hydrogen separation membrane work. In addition, the hydrogen yield is 60% to 70%, and thus needs to be increased further.

The inventors invented, as shown in Patent Document 2, a hydrogen production device that produces high-purity hydrogen using ammonia as raw material. When the device disclosed in Patent Document 2 is made large, the energy efficiency may become poor, which meant that hydrogen yield might decrease when there was a need for large-scale production of hydrogen.

RELATED ART DOCUMENTS

Patent Documents

Patent Document 1: JP2014-214060
Patent Document 2: JP2014-70012

DISCLOSURE OF THE INVENTION

Problems to be Solved by the Invention

The present invention was made in view of the circumstances stated above, and an object thereof is to provide a hydrogen recycle system that recovers hydrogen from an exhaust gas of a nitride compound production device at a high yield and reuses it as high-purity hydrogen, and a method for recycling hydrogen from an exhaust gas of a nitride compound production device.

Means for Solving the Problems

The hydrogen recycle system for a nitride compound production device according to the present invention includes an exhaust gas supply path that receives exhaust gas emitted from a nitride compound production device, a hydrogen recycle means that purifies high-purity hydrogen from the exhaust gas, and a hydrogen supply path that supplies high-purity hydrogen from the hydrogen recycle means to the nitride compound production device. The hydrogen recycle means of the hydrogen recycle system according to the present invention is characterized in that it includes a plasma reaction vessel that defines at least a part of a discharge space, a hydrogen separation membrane that divides the discharge space from a hydrogen flow path in communication with the hydrogen supply path, defines at least a part of the discharge space by one surface thereof and also defines at least a part of the hydrogen flow path by the other surface thereof, an electrode that is disposed outside the discharge space, and an adsorbent that is filled in the discharge space and adsorbs the supplied exhaust gas.

In the hydrogen recycle system according to the present invention, it is preferable that the nitride compound production device is an MOCVD device.

In the hydrogen recycle system according to the present invention, it is preferable that the adsorbent filled in the discharge space of the hydrogen recycle means is zeolite and/or activated alumina.

It is preferable that the hydrogen recycle system according to the present invention further includes an ammonia storage vessel and an ammonia supply path that connects the ammonia storage vessel to the discharge space of the hydrogen recycle means, and that it is possible to supply ammonia to the discharge space.

The present invention also provides a method for recycling hydrogen from an exhaust gas emitted by a nitride compound production device using the hydrogen recycle means. Here, the hydrogen recycle means includes a discharge space, at least part of a wall section of which is defined by a plasma reaction vessel and a hydrogen separation membrane, an adsorbent contained in the discharge space, and a hydrogen flow path divided from the plasma reaction vessel by the hydrogen separation membrane. The hydrogen recycle method according to the present invention is characterized in that it includes the following steps: introducing exhaust gas emitted by the nitride compound production device into the discharge space via the exhaust gas supply path; adsorbing the hydrogen molecules and hydrides contained in the exhaust gas onto the adsorbent; causing an electric discharge in the discharge space to cause the matter adsorbed onto the adsorbent to desorb from the adsorbent as atoms; reducing the pressure in the hydrogen flow path so that the hydrogen atoms in the discharge space permeate the hydrogen separation membrane; introducing the hydrogen atoms that have permeated the hydrogen separation membrane into the hydrogen flow path as hydrogen molecules; and supplying the hydrogen introduced into the hydrogen flow path to the nitride compound production device via the hydrogen supply path.

The hydrogen recycle method according to the present invention preferably further includes a step of supplying ammonia to the discharge space to produce hydrogen.

Effects of the Invention

In the hydrogen recycle system and hydrogen recycle method according to the present invention, the adsorbent filled in the discharge space of the hydrogen recycle means adsorbs exhaust gas supplied from the nitride compound production device. Since the exhaust gas remains in the discharge space in a state of being adsorbed onto the adsorbent until the exhaust gas decomposes into hydrogen atoms and other atoms, it is possible to decompose approximately all the exhaust gas into hydrogen atoms and other atoms. Of the decomposition products in the discharge space, the hydrogen separation membrane only transmits hydrogen atoms, such that a hydrogen gas with a high purity corresponding to the hydrogen content in the exhaust gas is introduced into the hydrogen flow path at a high yield. The present invention makes it possible to recover high-purity hydrogen gas from an exhaust gas of a nitride compound production device at a high yield, and to achieve a hydrogen recycle rate of nearly 100%.

The hydrogen recycle means according to the present invention is capable of separating and purifying hydrogen even if both the pressure of the supplied exhaust gas and the hydrogen partial pressure are low, and even if the exhaust gas is at room temperature. Therefore, with the hydrogen recycle means according to the present invention there is no need for any devices for pre-treatment of the exhaust gas, such as pressurizing means or heating means. This allows the hydrogen recycle system according to the present invention to be of a simpler configuration, and to be miniaturized.

Since applying the hydrogen recycle system and hydrogen recycle method according to the present invention increases the hydrogen recycle rate compared to conventional methods, it is possible to reduce the amount of high-purity hydrogen introduced from the outside as raw material for the nitride compound production device.

By decomposing nearly all the supplied exhaust gas in the discharge space, the hydrogen recycle system according to the present invention is capable of significantly reducing the amount of supplied exhaust gas that is emitted from the device as exhaust gas. This allows for simplification of the exhaust gas treatment device.

By changing the type of adsorbent to fill the discharge space, it is possible for the hydrogen recycle system according to the present invention to handle exhaust gas containing a wide variety of components emitted by the nitride compound production device.

The hydrogen recycle system according to the present invention can produce hydrogen not only from exhaust gas but also directly from ammonia, and can supply the produced hydrogen to the nitride compound production device.

MODE FOR CARRYING OUT THE INVENTION

Figure 1:
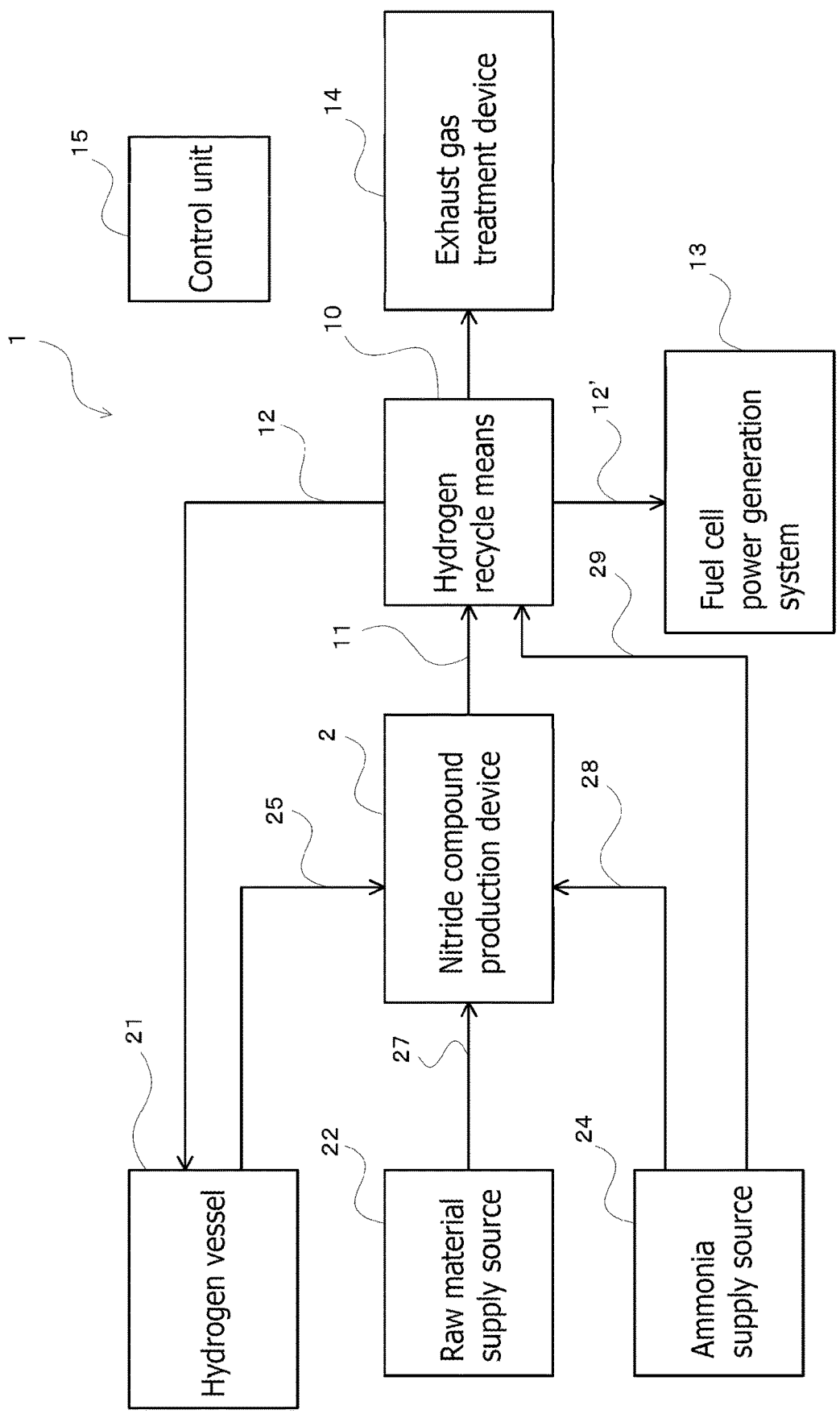
FIG. 1 is a block diagram showing the configuration of a hydrogen recycle system 1 according to an embodiment of the present invention and a nitride compound production device 2 that supplies exhaust gas to the hydrogen recycle system 1.
Figure 2:
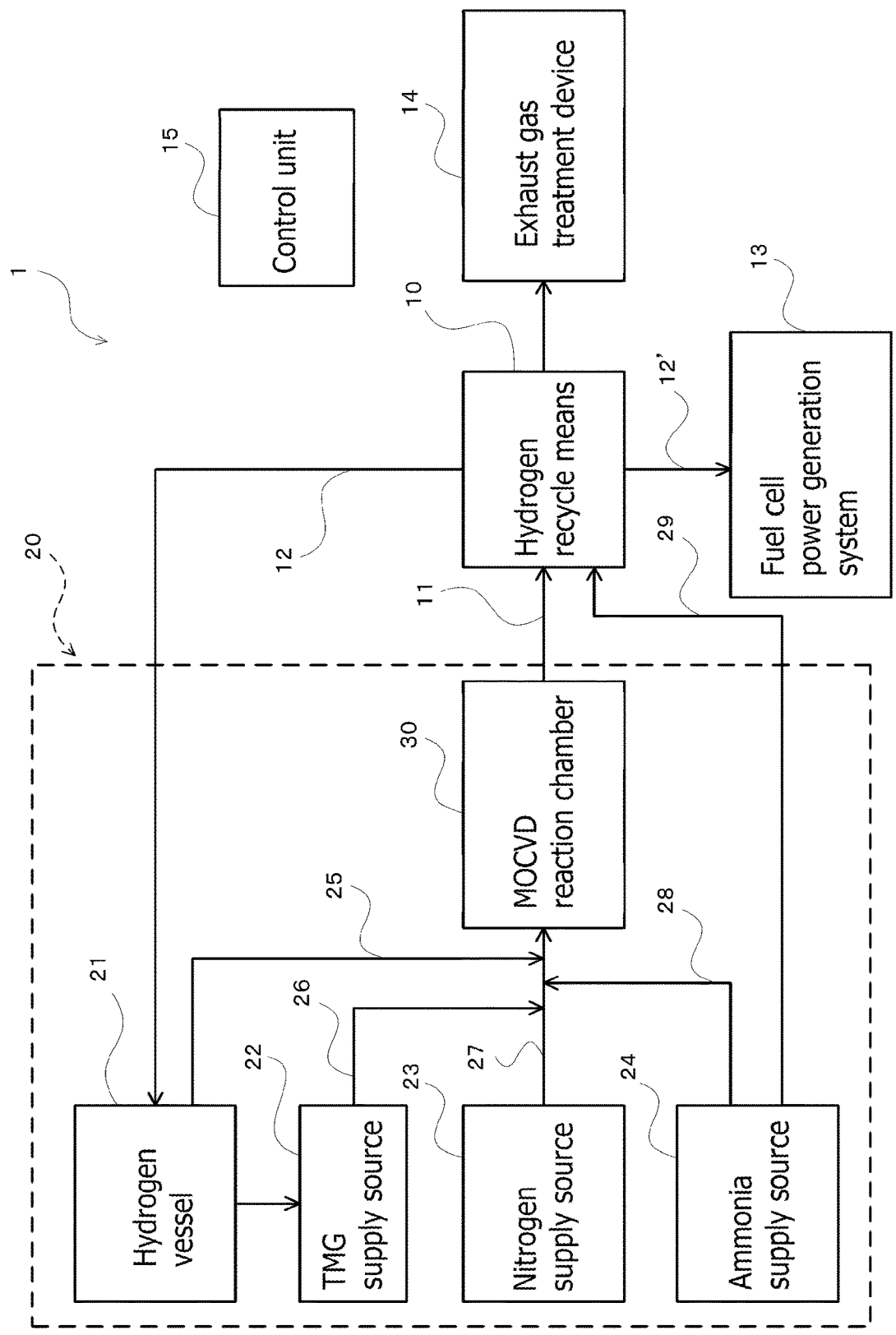
FIG. 2 is a block diagram showing the configuration of a hydrogen recycle system 1 according to an embodiment of the present invention and a metalorganic chemical vapor deposition device 20 that supplies exhaust gas to the hydrogen recycle system 1.
Figure 3:
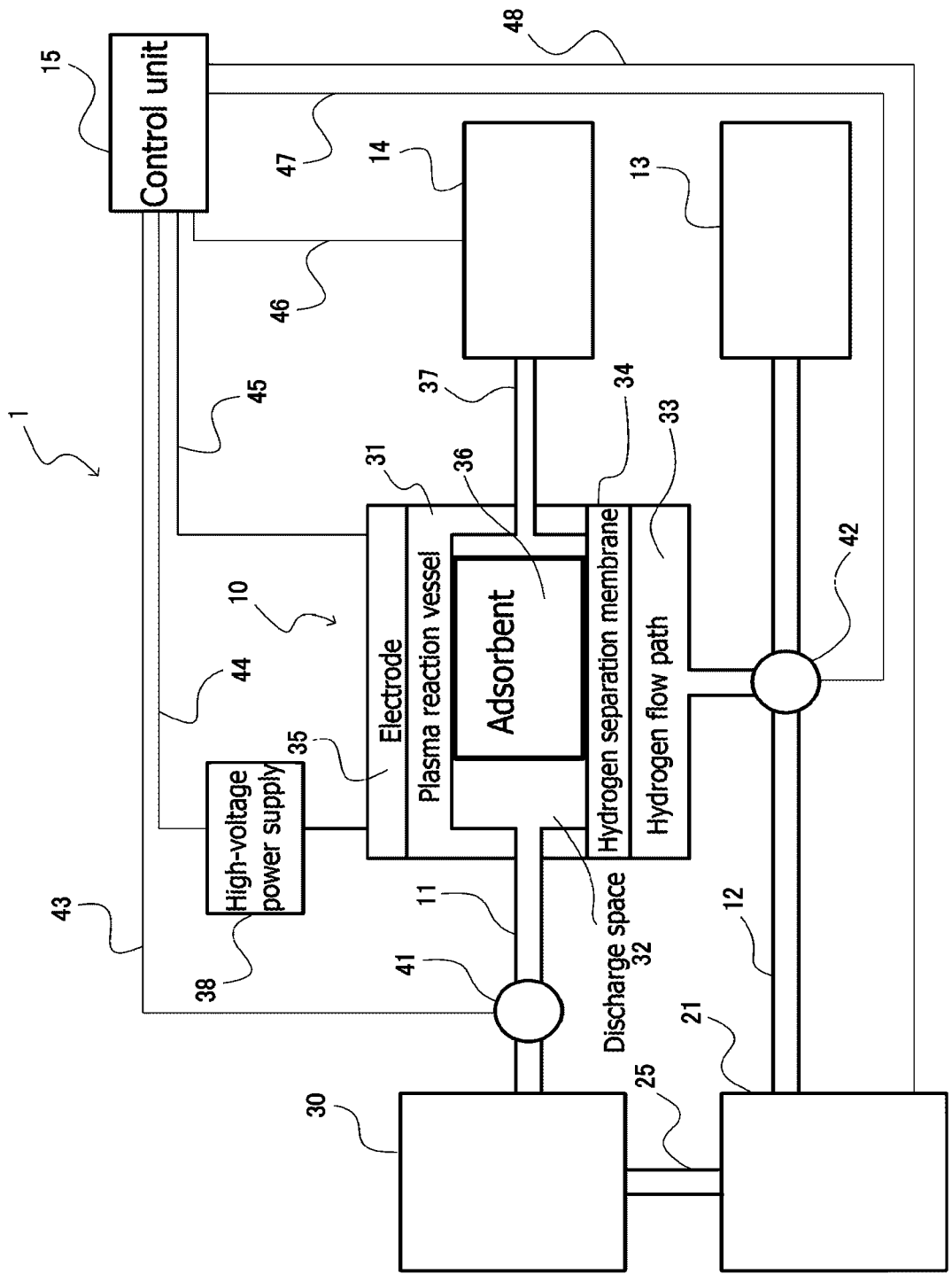
FIG. 3 is a block diagram schematically showing a hydrogen recycle means 10 and elements connected thereto.

FIG. 1 is a block diagram showing the configuration of a hydrogen recycle system 1 according to an embodiment of the present invention and a nitride compound production device 2 that supplies exhaust gas to the hydrogen recycle system 1. FIG. 2 is a block diagram showing the configuration of a metalorganic chemical vapor deposition device 20 (hereinafter referred to as the MOCVD device 20), which is an embodiment of the nitride compound production device, and a hydrogen recycle system 1 that recycles exhaust gas of the MOCVD device. FIG. 3 is a block diagram schematically showing a hydrogen recycle means 10 of the hydrogen recycle system 1 and other devices connected to the hydrogen recycle means 10. The hydrogen recycle system 1 includes an exhaust gas supply path 11 that receives exhaust gas, the hydrogen recycle means 10 that purifies high-purity hydrogen from the exhaust gas, and a hydrogen supply path 12 that supplies the purified high-purity hydrogen. The hydrogen recycle system 1 also includes a control unit 15.

The nitride compound production device 2 shown in FIG. 1 is a device that causes a chemical reaction of hydrogen supplied from a hydrogen vessel 21, raw material supplied from a raw material supply source 22, and ammonia supplied from an ammonia supply source 24 to produce a nitride compound. The nitride compound production device 2 uses various raw materials depending on the type of compound to be produced. The raw material supplied from the raw material supply source is supplied to the nitride compound production device 2 via a pipe 27. In addition, the hydrogen vessel 21 and the nitride compound production device 2 are connected via a pipe 25, and the ammonia supply source 24 is connected via a pipe 28.

The MOCVD device 20, which is an embodiment of the nitride compound production device, and the hydrogen recycle system 1 connected thereto will be described in detail below with reference to FIG. 2 and FIG. 3.

The MOCVD reaction chamber 30 of the MOCVD device 20 and the hydrogen recycle means 10 are connected by the exhaust gas supply path 11. The hydrogen-containing exhaust gas emitted by the MOCVD device 20 is emitted into the exhaust gas supply path 11 and supplied to the hydrogen recycle means 10. In the present embodiment, it is possible to connect a plurality of hydrogen recycle means 10 to the exhaust gas supply path 11 in parallel. On the exhaust gas supply path 11 there is disposed a flow rate regulating means 41 that also serves as a distribution means. The flow rate regulating means 41 distributes exhaust gas to be supplied to each hydrogen recycle means 10 depending on the amount of supplied exhaust gas, and regulates the flow rate and pressure of the exhaust gas.

The MOCVD device shown in FIG. 2 includes an MOCVD reaction chamber 30 that decomposes an organometallic material and causes a chemical reaction inside the reaction chamber at a high temperature, and forms a thin film by epitaxial growth on a substrate. Various raw material gases, carrier gases, and, if necessary, purging gases, are used in the MOCVD device depending on the type of semiconductor to be produced, and the device includes storage means and supply paths for these gases. In one example, which does not limit the scope of claims, when the MOCVD device produces a gallium nitride semiconductor by growing and stacking GaN, trimethylgallium (hereinafter referred to as TMG) is used as the main organometallic material. As the carrier gas of the TMG, ultra-pure hydrogen (with a purity of 99.99999%) is used. In addition, as the raw material gas for nitriding the gallium, ammonia is used. As the carrier gas in the MOCVD reaction chamber 30, nitrogen is used. In FIG. 2, the hydrogen supply source supplying hydrogen to the MOCVD reaction chamber 30 is shown as the hydrogen vessel 21, and the trimethylgallium supply source is shown as the TMG supply source 22. The hydrogen vessel 21 and the MOCVD reaction chamber 30 are connected via the pipe 25. The TMG supply source 22 and the MOCVD reaction chamber 30 are connected via the pipe 26. In addition, the hydrogen vessel 21 and the TMG supply source 22 are also connected via a pipe. The nitrogen supply source 23 and the ammonia supply source 24 are also connected to the MOCVD reaction chamber 30 respectively via the pipes 27 and 28.

The MOCVD reaction chamber 30 of the MOCVD device 20 and the hydrogen recycle means 10 are connected by the exhaust gas supply path 11. The hydrogen-containing exhaust gas emitted by the MOCVD device 20 is emitted into the exhaust gas supply path 11 and supplied to the hydrogen recycle means 10. In the present embodiment, a plurality of hydrogen recycle means 10 can be connected to the exhaust gas supply path 11 in parallel. On the exhaust gas supply path 11 there is disposed a flow rate regulating means 41 that also serves as a distribution means. The flow rate regulating means 41 distributes exhaust gas to be supplied to each hydrogen recycle means 10 depending on the amount of supplied exhaust gas, and regulates the flow rate and pressure of the exhaust gas.

The hydrogen recycle means 10 includes a plasma reaction vessel 31, a hydrogen separation membrane 34, and an electrode 35. The plasma reaction vessel 31 transforms matter contained therein into plasma by an electric discharge generated in the vessel interior. The plasma reaction vessel 31 can be made of glass such as quartz glass, ceramics such as alumina, or a highly insulating resin such as barium titanate, polycarbonate, or acrylic. The most preferable material for the plasma reaction vessel 31 is glass. It is preferable that the plasma reaction vessel 31 forms a discharge space 32 therein, or forms part of a partition wall that defines the discharge space 32 together with another member. The hydrogen separation membrane 34 or another electrode may be used as the other member that defines the discharge space 32.

As a hydrogen separation membrane 34 that only transmits hydrogen atoms, a palladium alloy thin film may particularly preferably be used. Other applicable materials for the hydrogen separation membrane 34 include a zirconium-nickel (Zr—Ni) alloy film, a vanadium-nickel (V—Ni) alloy film, a niobium-nickel (Nb—Ni) alloy film, or a film consisting of an alloy of one or more metals selected from the group consisting of niobium (Nb), nickel (Ni), cobalt (Co), and molybdenum (Mo) with one or more metals selected from the group consisting of vanadium (V), titanium (Ti), zirconium (Zr), tantalum (Ta), and hafnium (Hf).

FIG. 3 shows a configuration of the plasma reaction vessel 31 and the hydrogen separation membrane 34 of the hydrogen recycle means 10, in which the plasma reaction vessel 31 and the hydrogen separation membrane 34 form a closed space, this closed space constituting the discharge space 32. The discharge space 32 and the hydrogen flow path 33 are divided from each other by the hydrogen separation membrane 34. In other words, the discharge space 32 is formed between the plasma reaction vessel 31 and the hydrogen separation membrane 34, the discharge space 32 and the hydrogen flow path 33 are separately defined by the hydrogen separation membrane 34, wherein one surface of the hydrogen separation membrane 34 is exposed to the discharge space 32, and the other surface is exposed to the hydrogen flow path 33.

The electrode 35 is preferably disposed in a position facing the hydrogen separation membrane 34 with the plasma reaction vessel 31 interposed therebetween. A high-voltage power supply 38 is provided for supplying power to the hydrogen separation membrane 34 or the electrode 35 of the hydrogen recycle means 10. When the high-voltage power supply 38 is connected to the hydrogen separation membrane 34, the hydrogen separation membrane 34 functions as a high-voltage electrode and the electrode 35 is grounded and functions as a ground electrode. When the electrode 35 is connected to the high-voltage power supply 38, the electrode 35 functions as the high-voltage electrode and the hydrogen separation membrane 34 is grounded and functions as the ground electrode. The high-voltage power supply 38 applies a bipolar pulse waveform to the high-voltage electrode.

Zeolite and/or activated alumina may be used as the adsorbent 36 to be filled in the discharge space 32. When zeolite is used, the pore size is preferably 0.2 to 0.9 nanometers (2 to 9 angstrom).

The exhaust gas supplied from the exhaust gas supply path 11 to the hydrogen recycle means 10 is introduced into the discharge space 32. The hydrogen and ammonia in the exhaust gas is adsorbed by the adsorbent 36 that fills the discharge space 32. The adsorbed hydrogen and ammonia are transformed into atmospheric pressure non-equilibrium plasma by a dielectric barrier discharge between the electrode 35 and the hydrogen separation membrane 34. Of the adsorbed molecules, the hydrogen molecules decompose into hydrogen atoms and the ammonia molecules decompose into nitrogen atoms and hydrogen atoms and desorb from the adsorbent 36. The hydrogen flow path 33 is provided with a pump, not shown here, which reduces the pressure in the hydrogen flow path 33, so that the hydrogen atoms reach the surface of the hydrogen separation membrane 34 and permeate it. Of the plasma generated in the discharge space 32, only the hydrogen atoms can permeate the hydrogen separation membrane 34, such that the gas introduced into the hydrogen flow path 33 is ultra-pure hydrogen with a purity of 99.99999%. The hydrogen is introduced from the hydrogen flow path 33 into the hydrogen vessel 21 via the hydrogen supply path 12. In the hydrogen supply path 12 there is disposed a flow rate regulating means 42, which regulates the flow rate and pressure of the supplied hydrogen.

The exhaust gas emitted from the discharge space 32 passes through the exhaust gas flow path 37 and is introduced into the exhaust gas treatment device 14. When the exhaust gas was transformed into plasma in the discharge space, the ammonia was decomposed into nitrogen and hydrogen atoms and the hydrogen atoms were then separated. Therefore, the main components of the exhaust gas introduced into the exhaust gas treatment device 14 are nitrogen gas formed of the recombined nitrogen atoms, and TMG. TMG is removed from the nitrogen, which is released into the atmosphere.

Although not essential, it is possible to provide a means for pressurizing the discharge space 32 in order to further increase the hydrogen purification rate. Here, pressurizing the discharge space 32 means maintaining the discharge space 32 at a pressure higher than atmospheric pressure with the exhaust gas in a state of being adsorbed by the adsorbent 36. Even without pressurizing, the ammonia and hydrogen molecules will ultimately be 99.9% decomposed into hydrogen atoms, but by for example maintaining the discharge space 32 at a gauge pressure of 100 kPa to 200 kPa, the hydrogen gas can be purified faster and at a higher yield.

Further, it is also possible to provide an ammonia supply path 29 between the ammonia supply source 24 and the hydrogen recycle means 10 of the hydrogen recycle system 1. The ammonia supply source 24 can supply ammonia not only to the MOCVD reaction chamber 30, but also to the hydrogen recycle means 10 via the ammonia supply path 29. In addition, it is also possible to provide an ammonia decomposition catalyst in the ammonia supply path 29. By directly supplying ammonia from the ammonia supply source 24 to the hydrogen recycle means 10, it is possible to produce hydrogen not only from the exhaust gas, but also to efficiently produce hydrogen from the ammonia. In case an ammonia decomposition catalyst is provided, it is possible to supply a gas mixture of ammonia, hydrogen, and nitrogen from the ammonia supply path 29, which allows for an increase in purification efficiency of the hydrogen by the hydrogen recycle means 10. The purified hydrogen can be supplied to the MOCVD device and other external devices.

Still further, a fuel cell power generation system 13 can be connected to the hydrogen recycle system 1. As shown in FIG. 1 and FIG. 2, the hydrogen supply path may include a hydrogen supply path 12 that preferentially supplies hydrogen to the hydrogen vessel 21 until it has stored a predetermined amount of hydrogen, and a hydrogen supply path 12' that supplies hydrogen to the fuel cell power generation system 13 only when a sufficient amount of hydrogen is stored in the hydrogen vessel 21. Alternatively, as shown in FIG. 3, a hydrogen distribution function may be added to the flow rate regulating means 42, whereby the hydrogen supply path 12 is branched, with one branch connected to the fuel cell power generation system 13 to supply hydrogen.

Figure 5:
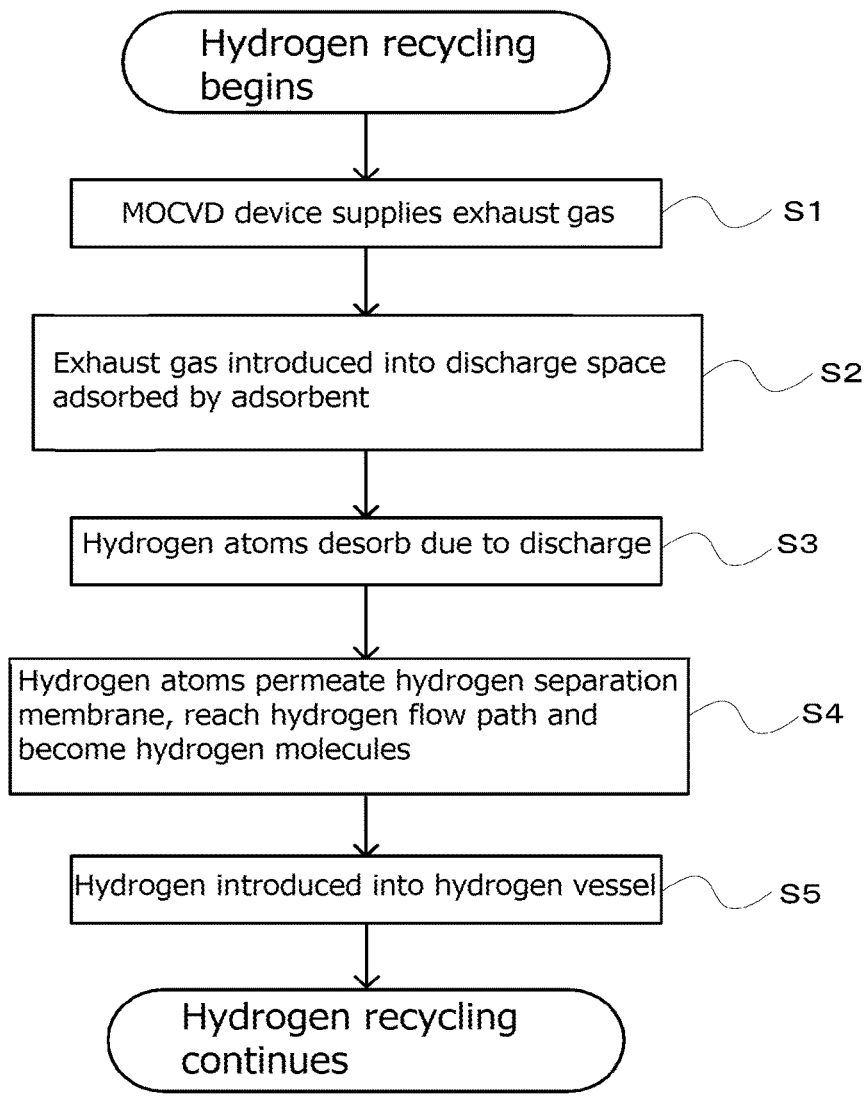
FIG. 5 is a flowchart showing the hydrogen recycle method according to the present invention.

FIG. 5 shows a hydrogen recycle method using the hydrogen recycle system according to the present invention.

FIG. 5 describes one embodiment of a method for recycling hydrogen emitted from the MOCVD device 20.

In the production process of gallium nitride semiconductors using metalorganic chemical vapor deposition, a large amount of ultra-pure hydrogen is continuously used as a carrier gas. The main components of the exhaust gas of the MOCVD device 20 are hydrogen and nitrogen, along with trace amounts of ammonia, trimethylgallium, and other semiconductor materials. The MOCVD device 20 supplies this exhaust gas via the exhaust gas supply path 11 to the hydrogen recycle means 10 (Step S1). The exhaust gas is introduced into the discharge space 32, and the hydrogen and ammonia therein are adsorbed by the adsorbent 36 and remain in the discharge space 32 (Step S2). By an electric discharge between the electrode 35 and the hydrogen separation membrane 34, the hydrogen and ammonia adsorbed by the adsorbent 36 are transformed into plasma, whereby the hydrogen molecules decompose into hydrogen atoms and the ammonia molecules decompose into nitrogen and hydrogen atoms and desorb from the adsorbent 36 (Step S3). Of the atoms decomposed by becoming plasma, only the hydrogen atoms are adsorbed by the hydrogen separation membrane 34, and scatter as they permeate the hydrogen separation membrane 34 until they reach the hydrogen flow path 33, where they recombine into hydrogen molecules. Further, from the hydrogen flow path 33, the hydrogen molecules pass through the hydrogen supply path 12 and are introduced into the hydrogen vessel 21 (Step S5).

The hydrogen recycle system 1 according to the present invention includes a control unit 15. The control unit 15 is communicably connected to the hydrogen recycle system 1 and its peripheral devices via control lines 43, 44, 45, 46, 47, and 48 and gathers necessary information to control the hydrogen recycle system 1. The control unit 15 performs the following control:

Via control line 43: monitors the flow rate of the exhaust gas in the exhaust gas supply path 11 and, in case a plurality of hydrogen recycle means 10 are connected, distributes exhaust gas to each hydrogen recycle means 10.

Via control line 47: controls the flow rate of hydrogen gas by the flow rate control means 42 and controls the pressure in the discharge space 32 through control of the flow rate of the exhaust gas via control line 43.

Via control line 44: controls the voltage applied by the high-voltage power supply 38.

Via control line 46: monitors the components of the exhaust gas introduced into the exhaust gas treatment device 14 and determines operating conditions for the exhaust gas treatment means.

Via control line 47: maintains reduced pressure in the hydrogen flow path 33.

Via control line 48: monitors the remaining amount of hydrogen in the hydrogen vessel 21.

Figure 4:
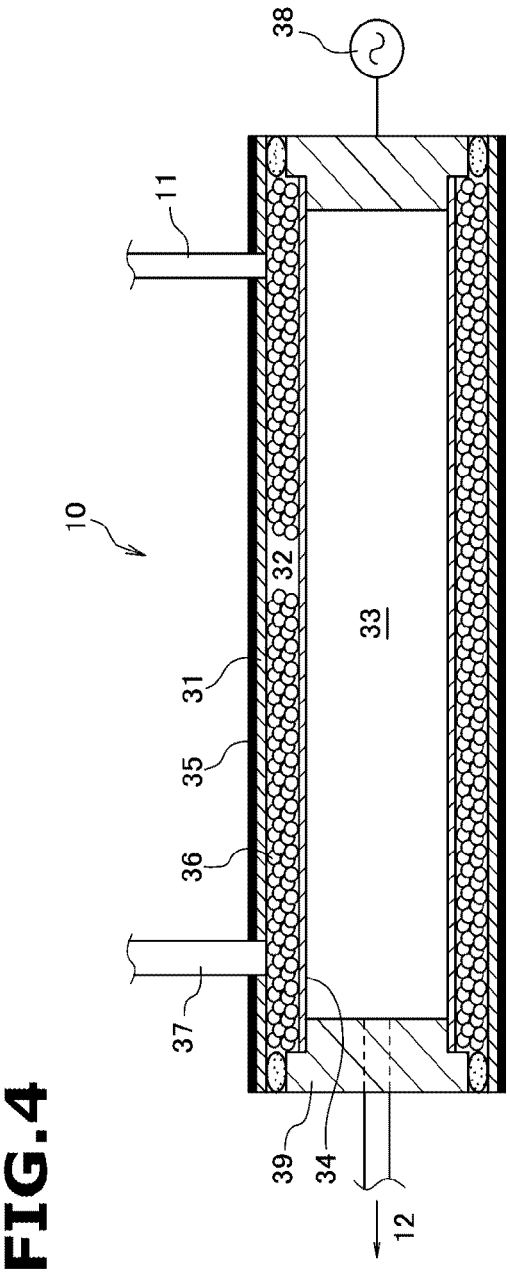
FIG. 4 is a vertical cross-sectional view of the hydrogen recycle means 10.

A realized example of the hydrogen recycle system 1 according to the present invention is described below with reference to FIG. 4. FIG. 4 is a vertical cross-sectional view of the hydrogen recycle means 10 according to an embodiment of the present invention. The hydrogen recycle means 10 includes a plasma reaction vessel 31 made of quartz glass in the form of a cylindrical dielectric body, in which the hydrogen separation membrane 34 in the form of a cylindrical palladium alloy thin film is housed. The hydrogen separation membrane 34 according to this example is disposed concentrically with the plasma reaction vessel 31 in a state of being supported by supports 39, and between the inner surface of the plasma reaction vessel 31 and the outer surface of the hydrogen separation membrane 34, the discharge space 32 is defined. The discharge space 32 is in communication with the exhaust gas flow path 11, and is supplied with exhaust gas consisting of hydrogen, nitrogen, ammonia, and trimethylgallium from the MOCVD device 20. The cylindrical space on the inside of the hydrogen separation membrane 34 forms the hydrogen flow path 33, which is in communication with the hydrogen supply path 12.

The grounded electrode 35 is disposed in contact with the outside of the plasma reaction vessel 31. In this example, the high-voltage power supply 38 is connected to the hydrogen separation membrane 34, such that the hydrogen separation membrane 34 functions as a high-voltage electrode. The high-voltage power supply 38 generates a bipolar pulse waveform with an extremely short retention time of 10 microseconds to supply electric power with a high electronic energy density to the hydrogen separation membrane 34. When a high voltage is applied to the hydrogen separation membrane 34, a dielectric barrier discharge occurs in the discharge space 32 between the inner surface of the plasma reaction vessel 31 and the hydrogen separation membrane 34.

The discharge space 32 is filled with the adsorbent 36. In this example, hydrophobic zeolite (HSZ® molded article, HSZ-900, made by Tosoh Corporation) in pellet form with an average pore size of 0.65 nanometers was used as the adsorbent 36.

In semiconductor production using metalorganic chemical vapor deposition, a large amount of ultra-pure hydrogen is continuously used. To give one example, one MOCVD device 20 uses 200 liters of ultra-pure hydrogen per minute. In addition, it uses 200 liters of nitrogen per minute as a carrier gas. Further, it uses 120 liters per minute of ammonia and 0.4 liters per minute of TMG as raw material. The MOCVD device 20 emits exhaust gas consisting of supplied hydrogen, nitrogen, ammonia, and TMG into the exhaust gas flow path 11. The exhaust gas, with the flow rate regulated by the flow rate regulating means 41, is introduced into the discharge space 32 of the hydrogen recycle means 10.

The hydrogen molecules and ammonia molecules in the exhaust gas suppled to the discharge space 32 are adsorbed by the adsorbent 36 and remain in the discharge space 32. The hydrogen molecules adsorbed by the adsorbent decompose into hydrogen atoms by a dielectric barrier discharge. Likewise, the adsorbed ammonia molecules decompose into hydrogen atoms and nitrogen atoms. The hydrogen atoms are adsorbed onto the surface of the hydrogen separation membrane 34, permeate the hydrogen separation membrane 34 and are introduced into the hydrogen vessel 21 via the hydrogen flow path 33. In order to efficiently make the hydrogen atoms become adsorbed onto and permeate the hydrogen separation membrane, it is possible to provide a vacuum pump to the hydrogen flow path to reduce the pressure in the hydrogen flow path. By reducing the pressure in the hydrogen flow path 33 to a gauge pressure of −50 kPa to −90 kPa, nearly 100% of the hydrogen generated in the discharge space 32 can be introduced into the hydrogen flow path 33.

The nitrogen generated by decomposing the ammonia in the exhaust gas, and the exhaust gas that was not adsorbed, are introduced into the exhaust gas treatment device 14. The exhaust gas treatment device 14 releases the nitrogen into the atmosphere and either adsorbs the TMG and other materials with an adsorbent or burns them. The supplied amount of TMG is small compared to the amount of carrier gas, and the exhaust gas treatment device 14 can be made smaller than in the conventional art.

The decomposition of ammonia carried out by the hydrogen recycle means 10 is a reaction based on the following formula:

$$2NH_3 \longrightarrow N_2 \longrightarrow 3H_2 \qquad \text{(Formula 1)}$$

Therefore, from 1 mol of ammonia it is possible to generate and recycle 1.5 mol of hydrogen.

The reaction rates of raw materials in MOCVD devices are generally considered rather low. Depending on production conditions, when an MOCVD device is supplied with 200 L/min of hydrogen and 120 L/min of ammonia, about the same amount of hydrogen gas and ammonia are emitted. Below is described an example in which the hydrogen recycle system 1 is supplied with 200 L/min of hydrogen and 120 L/min of ammonia.

Relative to a supply rate of 120 L/min of ammonia, the hydrogen recycle means can deliver high-purity hydrogen produced by decomposing the ammonia by the reaction of Formula (1) at a rate of 180 L/min of hydrogen to the hydrogen flow path 33. In addition, relative to a supply rate of 200 L/min of hydrogen gas, the hydrogen recycle means can deliver 200 L/min of hydrogen to the hydrogen flow path 33. As a result, the amount of hydrogen supplied by the hydrogen recycle means 10 to the hydrogen vessel 21 becomes 380 L/min. By recycling the initial supply of 200 L/min and supplying it to the MOCVD device 20, production can be continued in a stable manner. The hydrogen recycle system 1 supplies the remaining hydrogen to a connected fuel cell power generation system 13. The fuel cell power generation system 13 uses the supplied hydrogen to generate power and can supply that power to the hydrogen recycle system 1 to reduce the amount of energy required for the operation of the hydrogen recycle system 1.

Figure 6:
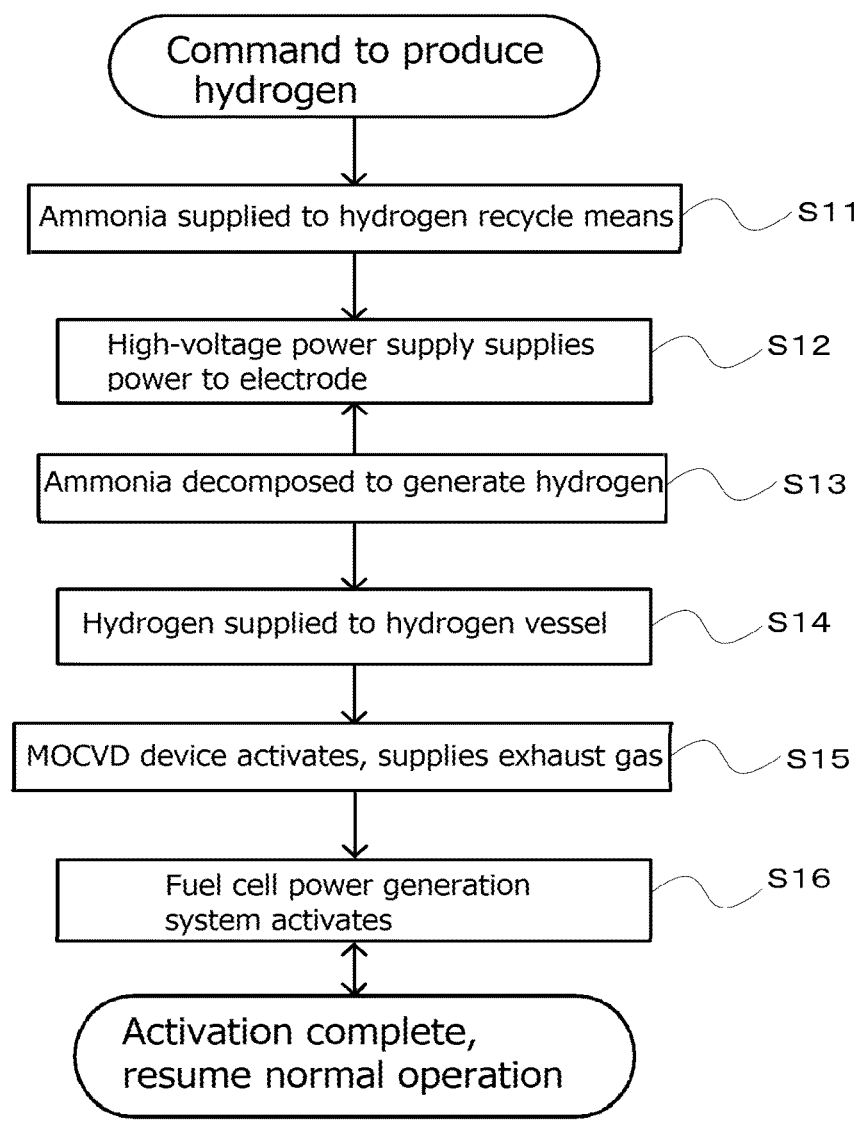
FIG. 6 is a flowchart showing an example of an operating method of the hydrogen recycle system according to the present invention.

FIG. 6 is a flowchart showing an example of an operating method of the hydrogen recycle system 1 according to the present invention used not only to recycle exhaust gas but also to produce hydrogen for the MOCVD device 20. Upon receiving a command to produce hydrogen, the hydrogen recycle means 10 receives a supply of ammonia from the ammonia supply path 29 connected to the ammonia supply source 24 (Step S11). Further, the high-voltage power supply 38 supplies power to the hydrogen separation membrane 34 (S12). By this supply of power, an electric discharge occurs in the discharge space 32, the supplied ammonia is decomposed, and hydrogen is purified (S13). The purified hydrogen is stored in the hydrogen vessel 21 via the hydrogen supply path 12 (S14). Using this hydrogen, the MOCVD device operates, and exhaust gas is supplied to the hydrogen recycle system 1 (S15). Hydrogen is produced from the exhaust gas, and excess hydrogen is supplied to the fuel cell power generation system 13 to start up the fuel cell power generation system (S16). In this way, the hydrogen recycle system 1, the MOCVD device 20, and the fuel cell power generation system 13 all operate, and normal operation begins.

Table 1 shows the production rate and recycle rate of hydrogen in a case where the hydrogen recycle means 10 according to this example is supplied by the exhaust gas supply path 11 with exhaust gas containing about 75% hydrogen gas, about 25% nitrogen gas, and 1000 ppm of ammonia. The supply rate of exhaust gas is varied from 1.0 to 5.0 L/min.

TABLE 1

| Hydrogen concentration in the exhaust gas (%) | Supply rate of exhaust gas (L/min) | Production rate of hydrogen (L/min) | Hydrogen recycle rate (%) |
| --- | --- | --- | --- |
| 75 | 1.00 | 0.68 | 90.1 |
| 75 | 3.00 | 2.03 | 90.1 |
| 75 | 5.00 | 2.99 | 79.7 |

The purity of the hydrogen gas produced by the hydrogen recycle means 10 and introduced into the hydrogen supply path 12 was 99.999% or higher, and the hydrogen recycle method was effective.

The hydrogen recycle system according to the present invention and method for recycling hydrogen using this hydrogen recycle system have been described above based on the example, but the invention according to the scope of claims is not limited to the example, and the configuration of the hydrogen recycle system can be changed as appropriate. For example, as a variant of the plasma reaction vessel, it is possible to apply a box-shaped or plate-shaped dielectric body having a discharge space formed therein. In this case, the hydrogen separation membrane covers the discharge space, and the hydrogen flow path can be provided over the hydrogen separation membrane as a separate vessel. The adsorbent of the hydrogen recycle means may be in pellet form, powder form, or any other form that can fill the discharge space and may be selected depending on the type of exhaust gas.

DESCRIPTION OF THE REFERENCE NUMERAL

1 Hydrogen recycle system
2 Nitride compound production device
10 Hydrogen recycle means
11 Exhaust gas supply path
12 Hydrogen supply path
13 Fuel cell power generation system
14 Exhaust gas treatment device
15 Control unit
20 Metalorganic chemical vapor deposition device (MOCVD device)
21 Hydrogen vessel
22 Raw material supply source (TMG supply source)
23 Nitrogen supply source
24 Ammonia supply source
25, 26, 27, 28 Pipes
29 Ammonia supply path
30 MOCVD reaction chamber
31 Plasma reaction vessel
32 Discharge space
33 Hydrogen flow path
34 Hydrogen separation membrane
35 Electrode
36 Adsorbent 36
37 Exhaust gas flow path
38 High-voltage power supply
39 Support
41, 42 Flow rate regulating means
43, 44, 45, 46, 47, 48 Control lines

The invention claimed is:

1. A hydrogen recycle system for a nitride compound production device, the hydrogen recycle system comprising:
    an exhaust gas supply path configured to receive exhaust gas emitted by the nitride compound production device;
    a hydrogen recycle means configured to purify hydrogen from the exhaust gas; and
    a hydrogen supply path configured to supply the purified hydrogen from the hydrogen recycle means to the nitride compound production device,
    wherein the hydrogen recycle means comprises:
    a plasma reaction vessel that defines at least a part of a discharge space;
    a hydrogen separation membrane that divides the discharge space from a hydrogen flow path communicated with the hydrogen supply path, defines at least a part of the discharge space by one surface thereof and defines at least a part of the hydrogen flow path by the other surface thereof;
    an electrode that is disposed outside the discharge space; and
    an adsorbent that is filled in the discharge space and configured to adsorb the exhaust gas that is supplied.

2. The hydrogen recycle system according to claim 1, wherein the nitride compound production device is a metalorganic chemical vapor deposition device.

3. The hydrogen recycle system according to claim 1, wherein the adsorbent comprises zeolite and/or activated alumina.

4. The hydrogen recycle system according to claim 1, further comprising:
    an ammonia storage vessel; and
    an ammonia supply path that connects the ammonia storage vessel to the discharge space of the hydrogen recycle means, wherein ammonia is supplied to the discharge space.

* * * * *